United States Patent [19]
Kobayashi et al.

[11] Patent Number: 5,214,392
[45] Date of Patent: May 25, 1993

[54] MULTILAYERED CERAMIC TYPE ELECTROMAGNETIC COUPLER APPARATUS

[75] Inventors: Tsunekazu Kobayashi, Kawasaki; Satoshi Sakuragi, Yokohama; Takeshi Ikeda, Sagamihara; Takashi Kuroda, Yokohama, all of Japan

[73] Assignee: Murata Mfg. Co., Ltd., Kyoto, Japan

[21] Appl. No.: 906,420

[22] Filed: Jun. 30, 1992

Related U.S. Application Data

[62] Division of Ser. No. 429,490, Oct. 31, 1989, abandoned.

[30] Foreign Application Priority Data

Nov. 8, 1988 [JP] Japan .................................. 63-281688

[51] Int. Cl.$^5$ .............................................. H03F 3/38
[52] U.S. Cl. .................................. 330/10; 330/207 A
[58] Field of Search ...................... 330/10, 207 A, 251; 336/147, 173, 174, 182

[56] References Cited

U.S. PATENT DOCUMENTS 4,608,541  8/1986  Moriwaki et al. .................... 330/10
4,755,783  7/1988  Fleischer et al. ................ 336/182 X Primary Examiner—Steven Mottola
Attorney, Agent, or Firm—Oliff & Berridge

[57] ABSTRACT

A multilayered ceramic electromagnetic coupler apparatus includes coils formed on ceramic substrates. The coils are laminated and have insulting layers between the ceramic substrates, a modulator section having an oscillator and a demodulator for outputting a transmitted signal.

19 Claims, 4 Drawing Sheets of application Ser. No. 07/429,490

MULTILAYERED CERAMIC TYPE ELECTROMAGNETIC COUPLER APPARATUS

This is a division of application Ser. No. 07/429,490 filed Oct. 31, 1989, now abandoned.

BACKGROUND OF THE INVENTION

The present invention relates to a multilayered ceramic type electromagnetic coupler for effecting the transmission of signals in an electrically insulated state by means of electromagnetically inductive action.

In a signal transmission circuit using a printed circuit or the like, there are cases where it is necessary to effect the transmission of signals with electrical insulation provided between two apparatuses for the purpose of elimination of noises or the like, and electrically insulated transformers and photo-couplers are conventionally used extensively as means for achieving this purpose.

Among the aforementioned means, the transformer has the advantage that signals to be transmitted can be covered in a wide range from a low frequency to a high frequency. However, since the transformer has a structure in which two or more types of coils are generally wound around a core, and its transmission characteristics improve with an increase in the number of turns of the coil, the apparatus tends to become very large in scale, resulting in increased production costs.

On the other hand, if a photo-coupler is used, since an input circuit and an output circuit is effected by optical coupling without electrically coupling them. Furthermore, since the transmission of signals is unidirectional, there is no need to take the unexpected feedback of signals into consideration. Thus, the photo-coupler has various advantages. However, these characteristics of the photo-coupler are exhibited on the precondition of transmission of binary digital signals. In the transmission of analog signals, drawbacks are encountered in terms of the temperature characteristic, the dynamic range, and so forth. For this reason, the photo-coupler can be used in a very limited range in the transmission of analog signals.

SUMMARY OF THE INVENTION

Accordingly, an object of the present invention is to provide a compact multilayered ceramic type electromagnetic coupler which exhibits stable and electrically positive insulation characteristics and signal transmission characteristics with a simple arrangement, thereby overcoming the above-described drawbacks of the conventional art.

To this end, in accordance with the present invention, there is provided a multilayered ceramic type electromagnetic coupler comprising: a plurality of ceramic substrates that are laminated; a plurality of coil elements respectively formed on surfaces of some of the ceramic substrates and arranged such that adjacent ones of the coil elements are offset from each other in such a manner as to partially oppose each other; and an insulating member disposed between adjacent ones of the plurality of ceramic substrates and adapted to electrically insulate adjacent ones of the plurality of coil elements, whereby the coil elements are electromagnetically coupled with each other.

In other words, the present invention provides a multilayered ceramic type electromagnetic coupler for effecting the transmission of a signal while securing electrical insulation characteristics by means of the electromagnetically coupling action of the coil elements respectively formed on the ceramic substrates.

In accordance with the present invention having the above-described arrangement, a structure in which a coil is wound around a core is not adopted.

In the present invention, since the coil is formed two-dimensionally on the ceramic substrate surface, and the substrates themselves can be formed into a thin configuration, even if a number of them are superposed on each other, the overall thickness of the substrate is very small. In addition, an electromagnetic coupler having very excellent insulating characteristics and signal transmission characteristics can be arranged.

Furthermore, the signal transmission characteristics can be further improved if a magnetic piece having a predetermined permeability is disposed in the vicinity of the coil elements, e.g., at a central position between two coil elements involved in coupling or on an outer side of the coil elements outside the coupler.

A connection between each coil element and an external circuit is effected through a conductive member disposed in the through-hole provided in the ceramic substrate, e.g., a conductive pin or conductive paste filled therein.

In addition, a pattern circuit may be provided in the vicinity of the coil element.

Furthermore, it is also possible to arrange the electromagnetic coupler in which the coil elements are alternately connected to each other for effecting a multiple connection.

In the production of the above-described coupler, for instance, the steps of printing, pressurizing and sintering are adopted. First, the coil elements are formed on unsintered ceramic substrates, and after the ceramic substrates with the coil elements printed thereon are laminated and pressurized, the assembly is sintered, thereby forming an integrated coupler.

Furthermore, an arrangement may be adopted in which a modulating section is connected to one of the two coil elements provided and a demodulating section to the other coil element, and the modulating section includes an oscillator and a modulator.

In this case, a signal input to the modulating section from an external circuit is used for modulation by the modulator of a carrier output from the oscillator. The carrier modulated by the signal is input to the demodulating section through electromagnetic coupling between the two coil elements. In the demodulating section, a signal is fetched from the carrier modulated as described above.

The above and other objects, features and advantages of the present invention will become more apparent from the following detailed description of the invention when read in conjunction with the accompanying drawings.

DESCRIPTION OF THE PREFERRED EMBODIMENTS

Referring now to the accompanying drawings, a description will be given of the preferred embodiments of the present invention.

Figure 1:
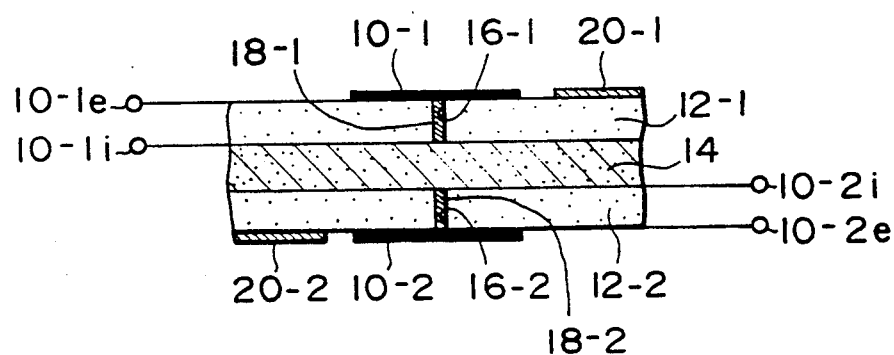
FIG. 1 is a cross-sectional view illustrating an arrangement of a multilayered ceramic type electromagnetic coupler in accordance with a first embodiment of the present invention.

FIG. 1 is a cross-sectional view of a multilayered ceramic electromagnetic coupler in accordance with a first embodiment of the present invention in which a pair of ceramic substrates 12-1 and 12-2 with a pair of coil elements 10-1 and 10-2 coated thereon are stacked with an insulating substrate 14 interposed therebetween. The coating of the ceramic substrates 12-1 and 12-2 with the coil elements 10-1 and 10-2 is effected by printing or the like.

For instance, green sheets of a ceramic material are prepared in order to form the ceramic substrates. Coil elements are formed from conductive paste on the unsintered substrates by a thick film printing method such as screen-printing or sputtering. Green sheets of an insulative ceramic material are prepared in order to form the insulating members. The insulative material may be prepared from glass or synthetic resin.

The coil element 10-1 formed on the ceramic substrate 12-1 has its beginning terminal 10-1i and ending terminal 10-1e led out from a lower surface and an upper surface of the ceramic substrate 12-1, respectively. Similarly, the coil element 10-2 formed on the other ceramic substrate 12-2 has its beginning terminal 10-2i and ending terminal 10-2e led out from an upper surface and a lower surface of the ceramic substrate 12-2, respectively.

The ceramic substrates 12-1 and 12-2 are respectively provided with through-holes 16-1 and 16-2. A conductive pin, for instance, is buried in these through-holes 16-1 and 16-2, or conductive paste is filled therein. Namely, the coil elements 10-1 and 10-2 are connected to each other through the through-holes 16-1 and 16-2 by means of conductive members 18-1 and 18-2 composed of a conductive pin or paste or the like, respectively.

Integrally formed on the respective surfaces of the ceramic substrates 12-1, 12-2 are pattern circuits 20-1, 20-2 disposed adjacent to the coil elements 10-1, 10-2 or via an insulating layer.

Accordingly, in accordance with this embodiment, it is possible to form the coil elements 10-1, 10-2 on the ceramic substrates 12-1, 12-2 simultaneously with the formation of the pattern circuits 20-1, 20-2. Consequently, it becomes possible to substantially simplify the circuit configuration.

For instance, in a normal case, the coil elements 10-1, 10-2 and other necessary pattern circuits 20-1, 20-2 are formed on the ceramic substrates 12-1, 12-2 by an appropriate means such as printing. The ceramic substrates 12-1, 12-2 carrying the pattern circuits 20-1, 20-2 and the coil elements 10-1, 10-2 are superposed on each other in the form of a multilayer and are pressurized. Then, when a stacked substrate thus obtained is sintered by heating, a fine circuit of a multilayered ceramic type in which the pattern circuits 20-1, 20-2 and the coil elements 10-1, 10-2 are incorporated as a unit is obtained.

In accordance with such a coupler in which the pattern circuits 20-1, 20-2 and the coil elements 10-1, 10-2 are formed as a unit, it becomes possible to integrally form a device including a coil in its circuit, such as a modem, without externally attaching the coil thereto. As a result, it becomes possible to form a highly versatile electromagnetic coupler, integrally including coils, which has a simple arrangement and can be made compact as compared with, for instance, a coupler in which a coil is assembled to an IC circuit by being externally attached thereto by a conventional means.

Figure 2:
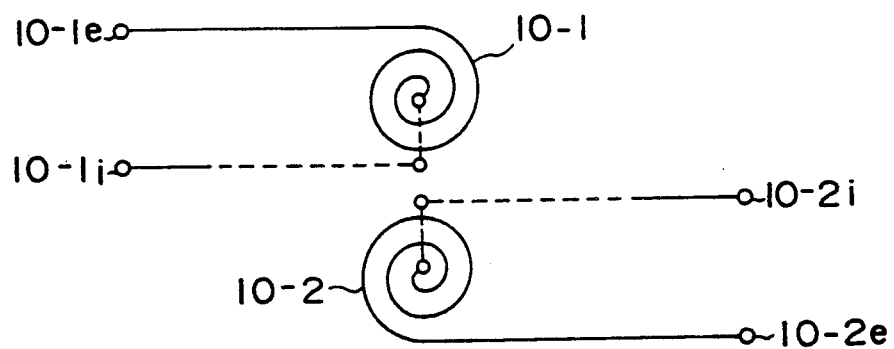
FIG. 2 is a schematic diagram of the coupler shown in FIG. 1.

FIG. 2 is a schematic diagram in which the ceramic substrates 12-1, 12-2 and the insulating substrate 14 are omitted in the coupler shown in FIG. 1, and illustrates the relative positional relationship between the coil elements 10-1, 10-2. Although the coil elements 10-1 and 10-2 are formed in such a manner as to oppose each other with a gap constituted by the combined lengths of the ceramic substrates 12-1, 12-2 and the insulating substrate 14, as is apparent from FIG. 1, since the respective thicknesses of the substrates 12-1, 12-2 and 14 are very small, the distance between the coil elements 10-1 and 10-2 is small. For this reason, the pair of coil elements 10-1, 10-2 are set in a state in which they are closely coupled with each other by a a coupling coefficient corresponding to the combined thicknesses of the substrates 12-1, 12-2, and 14.

Figure 3:
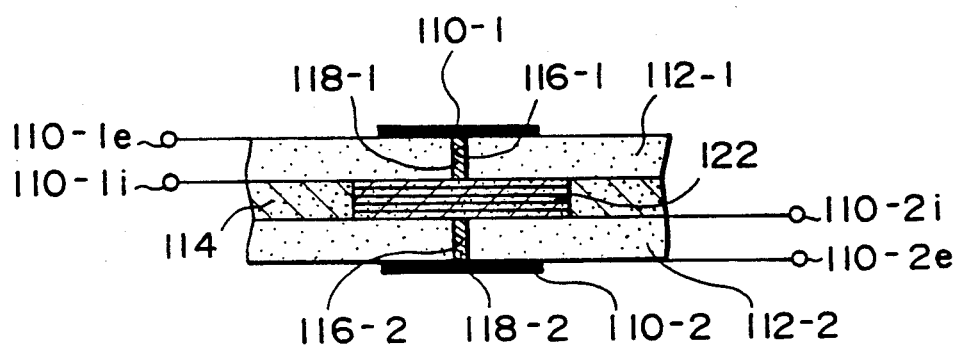
FIG. 3 is a cross-sectional view illustrating an arrangement of a second embodiment of the present invention in which a further improvement is made on the embodiment shown in FIG. 1 by adding a magnetic piece 122 thereto.

FIG. 3 illustrates an arrangement of a second embodiment of the present invention in which a further improvement is made on the embodiment shown in FIG. 1 by inserting a magnetic piece 122 in a part of the insulating substrate 114 placed between the ceramic substrates 112-1 and 112-2 on which the coil elements 110-1, 110-2 are formed.

According to this embodiment, the number of interlinkages occurring from magnetic flux induced by a signal input from, for example, the coil element 110-1 to the other coil element 110-2 increases with the permeability of the magnetic piece 122, so that the signal transmission efficiency of the coupler improves appreciably. It should be noted that a similar effect can be obtained if a magnetic substrate or the like is used instead of the magnetic piece, as required.

Figure 4:
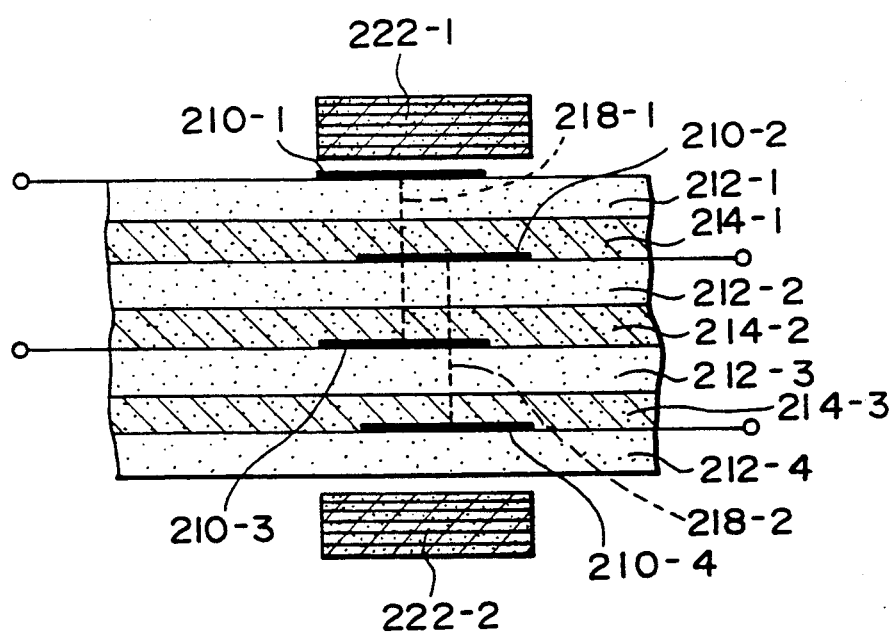
FIG. 4 is a cross-sectional view illustrating an arrangement of a third embodiment of the present invention, in which magnetic pieces 222-1 and 222-2 are disposed adjacent to the outer sides of coil elements 210-1 and 210-4, respectively, and four coil elements 210-1, 210-2, 210-3, 210-4 are arranged alternately.

FIG. 4 illustrates an arrangement of a third embodiment of the present invention. In this embodiment, an attempt is made to improve the performance of electromagnetic coupling by increasing the number of turns of the primary and secondary coils, thereby increasing the number of magnetic flux interlinkages. For this purpose, a two-pair, i.e., four-layered, structure is adopted. In other words, coil elements 210-1, 210-2, 210-3, 210-4 respectively coated on different ceramic substrates 212-1, 212-2, 212-3, 212-4 are formed into an alternately arranged four-stage structure. In addition, the coil elements 210-1 and 210-3 and the coil elements 210-2 and 210-4 are respectively connected to each other by means of conductive members 218-1 and 218-2 indicated by broken lines in the drawing. Thus, the coil elements 210-1 and 210-3 constitute a primary coil, and the coil elements 210-2 and 210-4 a secondary coil. It should be noted that the through-holes for the provision of the conductive members 218-1 and 218-2 are not shown in this drawing.

In this embodiment, magnetic pieces 222-1 and 222-2 that are similar to those of the second embodiment are respectively disposed on the upper and lower surfaces of the four-layered substrate in such a manner as to oppose each other, as shown in FIG. 4. Hence, a similar effect can be obtained in the improvement of the transmission efficiency.

Figure 5:
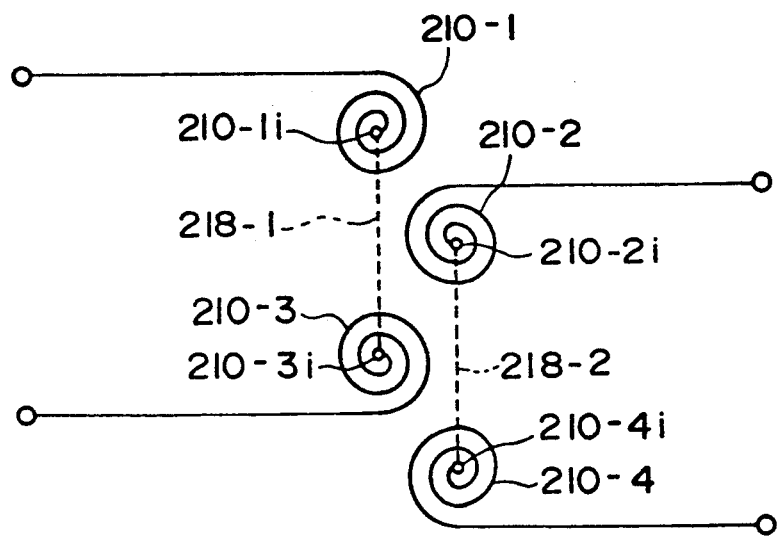
FIG. 5 is a schematic diagram of the coupler illustrated in FIG. 4.
Figure 6:
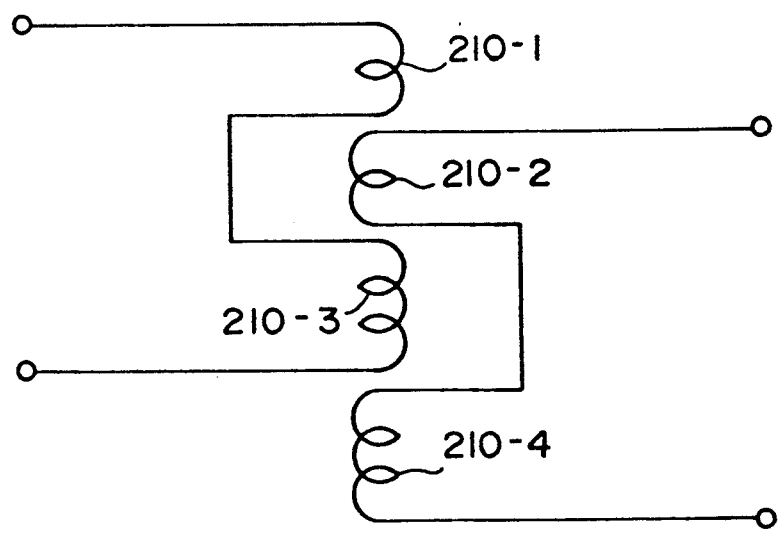
FIG. 6 is an equivalent circuit diagram of the coupler shown in FIG. 4.

FIGS. 5 and 6 respectively show the four-layered structure in accordance with this embodiment in a simplified form or by way of an equivalent circuit.

In accordance with the foregoing embodiments, since the electromagnetic coupler is formed by laminating ceramic substrates on which coil elements are printed planarly or two-dimensionally thereon, it is possible to provide an electromagnetic coupling structure which is very thin and compact and excels in the transmission characteristics and electrical insulation characteristics. Thus, it is possible to make the performance of the coupler and the compact size compatible.

In order to improve the transmission efficiency further and enhance the transmission efficiency of a low frequency, in particular, at the time when a coupler having such a structure is applied to a data communication apparatus or the like, it suffices to provide amplitude modulation using a high frequency carrier for the transmission signal.

Figure 7:
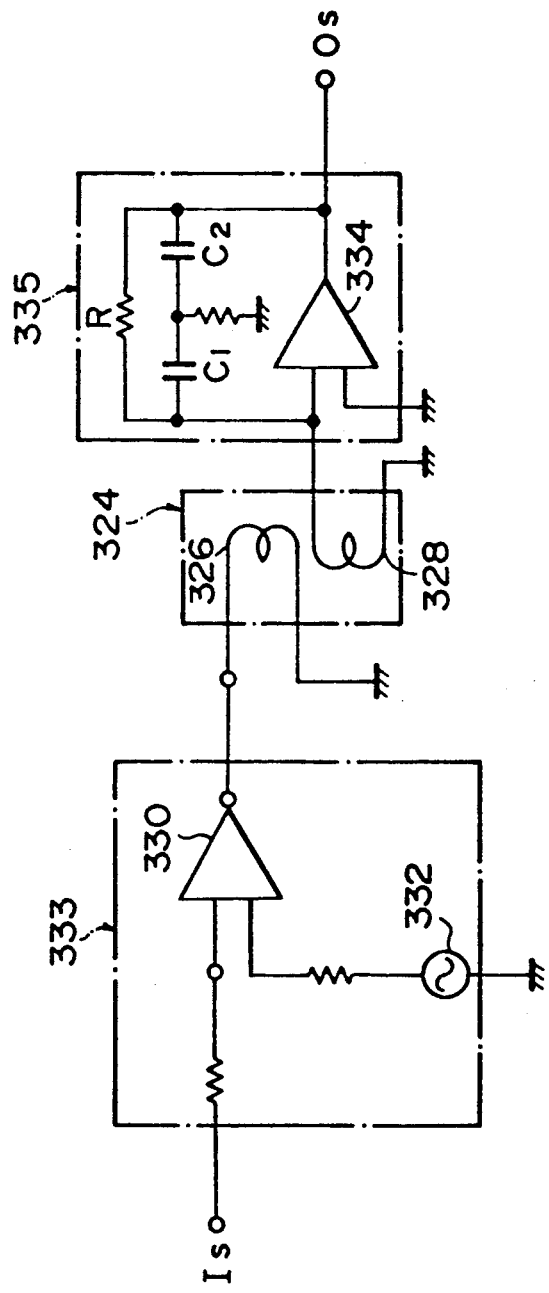
FIG. 7 is a circuit diagram illustrating a fourth embodiment of the present invention, illustrating a modulation section 333, a demodulating section 335, and a coupling section 324 shown by an equivalent circuit.

FIG. 7 illustrates a configuration of a fourth embodiment of the present invention. Referring now to this drawing, a description will be given of the operation of this embodiment.

First, in an amplifier 330, an input signal Is is superimposed on a carrier signal supplied from a carrier frequency oscillator 332 (i.e., subjected to high-frequency modulation), and is then supplied to a primary coil 326 of a coupling section 324 having an arrangement similar to that of the first embodiment. As this primary coil 326, the coil element in accordance with the present invention or a series connection thereof is used.

Thus, the input signal Is is subjected to high-frequency modulation in a modulation section 333, including the amplifier 330 and the carrier frequency oscillator 332, and input to the primary coil 326 is transmitted efficiently to a secondary coil 328 having a structure similar to that of the primary coil 326, and a voltage signal appearing at an output terminal of the secondary coil 328 is input to an amplifier 334 incorporated in a demodulating section 335 connected to the secondary coil 328. An integrating circuit comprising a resistor R and capacitors $C_1$ and $C_2$ is connected to input and output terminals of the amplifier 334, and after the high-frequency component is removed by this integrating circuit (i.e., after the signal is demodulated), the signal is transmitted to a processing circuit in the next stage as an output signal Os.

It should be noted that a ceramic filter or a SAW filter may be used instead of the integrating circuit. These filters are connected to the input or output side of the amplifier 334.

As described above, by using the multilayered ceramic type electromagnetic coupler, it is possible to provide an efficient signal transmission apparatus which is capable of securing excellent insulation characteristics.

What is claimed is:

1. A multilayered ceramic type electromagnetic coupler apparatus, comprising:
   a coupling section including first and second coil elements and adapted to electromagnetically couple said coil elements, said first and second coil elements are formed on ceramic substrates, wherein said ceramic substrates are laminated and have an insulating member disposed between adjacent ones of said ceramic substrates;
   a modulator section which includes an oscillator for oscillating at a predetermined carrier frequency and a modulator for modulating a carrier input from said oscillator by means of a signal supplied from an external circuit and which is adapted to supply said modulated carrier to said first coil element; and
   a demodulating section adapted to output a signal after demodulating said modulated carrier output from said second coil element.

2. A signal transmission apparatus comprising:
   a first coil element;
   a second coil element electromagnetically coupled with said first coil element;
   oscillator means for generating a high frequency carrier;
   means for modulating said carrier by means of a signal input from an external circuit to produce a modulated signal and for supplying said modulated signal to said first coil element;
   means for demodulating said modulated signal input via the electromagnetic coupling between said first and second coil elements; and
   a plurality of ceramic substrates that are laminated having a predetermined number of insulating members disposed between adjacent ones of said ceramic substrates, said first and second coil elements being formed on some of said plurality of ceramic substrates.

3. The signal transmission apparatus of claim 2, wherein said modulating means further comprises means for amplifying said modulated signal and supplying the signal to said first coil element.

4. The signal transmission apparatus of claim 2, wherein said demodulating means comprises means for integrating said modulated signal from said second coil element and thereby removing a high frequency component.

5. The signal transmission apparatus of claim 4, wherein said integrating means comprises means for amplifying said modulated signal from said second coil element and means for determining a time constant for integrating said modulated signal.

6. A signal transmission apparatus comprising:
   a plurality of coil elements arranged so that adjacent coil elements are electromagnetically coupled;
   a plurality of ceramic substrates that are laminated, said plurality of coil elements being formed on some of said plurality of ceramic substrates respectively;
   an oscillator for generating a high frequency carrier;
   means for modulating said carrier by means of a signal input from an external circuit to produce a modulated signal and for supplying said modulated signal to one of said coil elements; and means for demodulating said modulated signal input via said plurality of coil elements.

7. The signal transmission apparatus of claim 6, wherein said plurality of coil elements are arranged such that adjacent ones of said coil elements are offset and partially opposite to each other.

8. The signal transmission apparatus of claim 6 further comprising a magnetic piece having predetermined permeability and disposed in the vicinity of said coil elements.

9. The signal transmission apparatus of claim 8, wherein said magnetic piece is interposed between at least two of said coil elements.

10. The signal transmission apparatus of claim 8, wherein said magnetic piece is disposed on an outer side of said coil elements.

11. The signal transmission apparatus of claim 6, wherein said coil elements are formed on said ceramic substrates by printing a conductive paste on unsintered ceramic substrates and sintering said unsintered ceramic substrates on which said conductive paste is printed.

12. The signal transmission apparatus of claim 11, wherein said ceramic substrates and insulating members are laminated alternately in a predetermined order.

13. The signal transmission apparatus of claim 6, further comprising a predetermined number of pattern circuits disposed on said ceramic substrates and connected to said coil elements.

14. The signal transmission apparatus of claim 6, wherein said ceramic substrates comprise conductive members connecting between some of said coil elements.

15. The signal transmission apparatus of claim 14, wherein said conductive members are provided in a predetermined number of throughholes at predetermined positions so as to connect one end to some of said coil elements.

16. The signal transmission apparatus of claim 15, wherein said conductive members are conductive pins buried in said throughholes.

17. The signal transmission apparatus of claim 15, wherein said conductive members are conductive pastes filled in said throughholes.

18. The signal transmission apparatus of claim 2, wherein said oscillator means comprises an oscillator which generates a carrier signal with a high frequency component.

19. The signal transmission apparatus of claim 6, further comprising a predetermined number of insulating members disposed between adjacent ones of said ceramic substrates.

* * * * *